United States Patent
Chiou et al.

(10) Patent No.: US 9,395,259 B2
(45) Date of Patent: Jul. 19, 2016

(54) PIEZORESISTIVE TRANSDUCER WITH LOW THERMAL NOISE

(71) Applicant: Continental Automotive Systems, Inc., Auburn Hills, MI (US)

(72) Inventors: Jen-Huang Albert Chiou, Libertyville, IL (US); Xiaoyi Ding, Lake Zurich, IL (US); Shiuh-Hui Steven Chen, Lake Zurich, IL (US); Jeffrey J. Frye, Grayslake, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 241 days.

(21) Appl. No.: 14/060,771

(22) Filed: Oct. 23, 2013

(65) Prior Publication Data

US 2014/0137653 A1 May 22, 2014

Related U.S. Application Data

(60) Provisional application No. 61/729,110, filed on Nov. 21, 2012.

(51) Int. Cl.
| | |
|---|---|
| *G01L 9/06* | (2006.01) |
| *G01L 9/00* | (2006.01) |
| *G01L 19/04* | (2006.01) |
| *G01L 19/00* | (2006.01) |
| *G01L 19/14* | (2006.01) |

(52) U.S. Cl.
CPC .............. *G01L 9/06* (2013.01); *G01L 9/0054* (2013.01); *G01L 19/04* (2013.01); *G01L 19/141* (2013.01); *G01L 19/0038* (2013.01); *G01L 19/147* (2013.01)

(58) Field of Classification Search
CPC ....... G01L 9/06; G01L 9/0054; G01L 19/147; G01L 19/142; G01L 19/0038
USPC ........................................... 73/721
See application file for complete search history.

(56) References Cited

U.S. PATENT DOCUMENTS

| | | | |
|---|---|---|---|
| 4,023,562 A | 5/1977 | Hynecek et al. | |
| 5,174,926 A * | 12/1992 | Sahagen | G01L 9/0055 252/519.13 |

(Continued)

FOREIGN PATENT DOCUMENTS

| | | |
|---|---|---|
| DE | 4231326 A1 | 4/1993 |
| EP | 0736756 A1 | 10/1996 |

(Continued)

OTHER PUBLICATIONS

Search Report dated May 2, 2013, from corresponding GB Patent Application No. GB1300934.5.

*Primary Examiner* — Harshad R Patel
*Assistant Examiner* — Brandi Hopkins (57) ABSTRACT

In a MEMS PRT having a diaphragm that is located offset from the center of the die, thermally-induced thermal noise in the output of a Wheatstone bridge circuit is reduced by locating the Wheatstone bridge circuit away from the largest area of the die and supporting pedestal.

21 Claims, 5 Drawing Sheets

(56) References Cited

U.S. PATENT DOCUMENTS

| | | | |
|---|---|---|---|
| 6,142,021 A | 11/2000 | Ross et al. | |
| 6,255,728 B1* | 7/2001 | Nasiri | G01L 19/0038 257/666 |
| 6,912,759 B2* | 7/2005 | Izadnegahdar | G01L 9/0055 216/56 |
| 8,230,745 B2* | 7/2012 | Rozgo | G01L 13/025 73/715 |
| 8,881,596 B2* | 11/2014 | Chiou | G01L 19/04 361/283.4 |
| 2010/0073123 A1* | 3/2010 | Craddock | G01L 19/0069 338/42 |
| 2011/0232389 A1* | 9/2011 | Chiou | G01L 9/0052 73/721 |
| 2013/0192378 A1* | 8/2013 | Chiou | G01L 19/04 73/721 |

FOREIGN PATENT DOCUMENTS

| | | |
|---|---|---|
| EP | 2166330 A1 | 3/2010 |
| WO | 96/22515 A1 | 7/1996 |

\* cited by examiner

PIEZORESISTIVE TRANSDUCER WITH LOW THERMAL NOISE

BACKGROUND

Micro-electromechanical systems (MEMS) piezoresistive transducers (PRTs) are well known and comprise a thin, silicon diaphragm supported over a pressure port by a pedestal. The pressure port is typically formed through a plastic housing, which can be attached to a source of a pressurized fluid, which can of course be liquid or gas. The pedestal that supports the diaphragm is typically attached to the housing by adhesive.

The diaphragm in which the piezoresistors are formed is supposed to deflect responsive to changes in the pressure of an applied fluid. Diaphragm deflection causes the size and shape of the piezoresistors to change, which causes their electrical resistance to change. The deflection of the diaphragm can thus be used to transduce or change a pressure into a measurable voltage change.

Plastic, adhesive, glass and silicon have different coefficients of thermal expansion. A well-known problem with mounting a thin diaphragm of single crystalline silicon, to a pedestal made of glass or silicon, which is also mounted to a plastic housing through adhesive, is the creation of thermally-induced stresses due to the different coefficients of thermal expansion. Thermally-induced stress will distort the shape of a diaphragm and distort the value of a measured pressure.

Those of ordinary skill in the art of MEMS PRTs know that the shape of a MEMS PRT is preferably a rectangular parallelepiped with the diaphragm being offset or located toward one side of the device or another. A problem with rectangular parallelepiped-shaped dies and pedestals that support the dies arises when the diaphragm is offset because offsetting the diaphragm tends to create uneven thermally-induced stresses in the die.

Uneven thermal stresses can be avoided by using a die and pedestal that is round or square, however, dies and pedestals that are square waste valuable space in a semiconductor wafer. Circular-shaped dies and pedestals are inefficient to fabricate. An apparatus for reducing thermally-induced electrical signals or noise would be an improvement over the prior art.

BRIEF SUMMARY

In a MEMS PRT having a diaphragm that is located offset from the center of the die, thermally-induced thermal noise in the output of a Wheatstone bridge circuit is reduced by locating the Wheatstone bridge circuit away from the largest area of the die and supporting pedestal.

DETAILED DESCRIPTION

Figure 1:
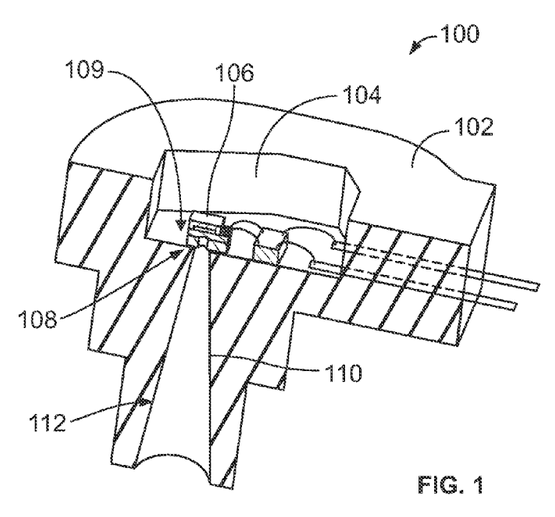
FIG. 1 is a sectional perspective view of a pressure sensor.

FIG. 1 is a sectional view of a pressure sensor 100. The pressure sensor 100 comprises a molded plastic housing 102 formed to have a pocket 104 inside the housing 102. The pocket 104 can be enclosed by a cover, which is omitted from FIG. 1 in order to show the pocket's interior.

The pocket 104 encloses a micro-electromechanical system (MEMS) piezoresistive pressure transducer 106, (PRT) which is described below. The MEMS PRT 106 is attached to the bottom 109 of the pocket 104 so that the MEMS PRT 106 is located above a hole 108 formed in the bottom 109 of the pocket 104.

The hole 108 in the bottom 109 of the pocket 104 is actually the top opening of a pressure port 110 comprising a tube 112 that is formed through the housing 102. The pressure port 110 is thus able to direct a pressurized fluid from outside the housing 102, through the housing 102 and against a flexible diaphragm located in the MEMS PRT 106.

Figure 2:
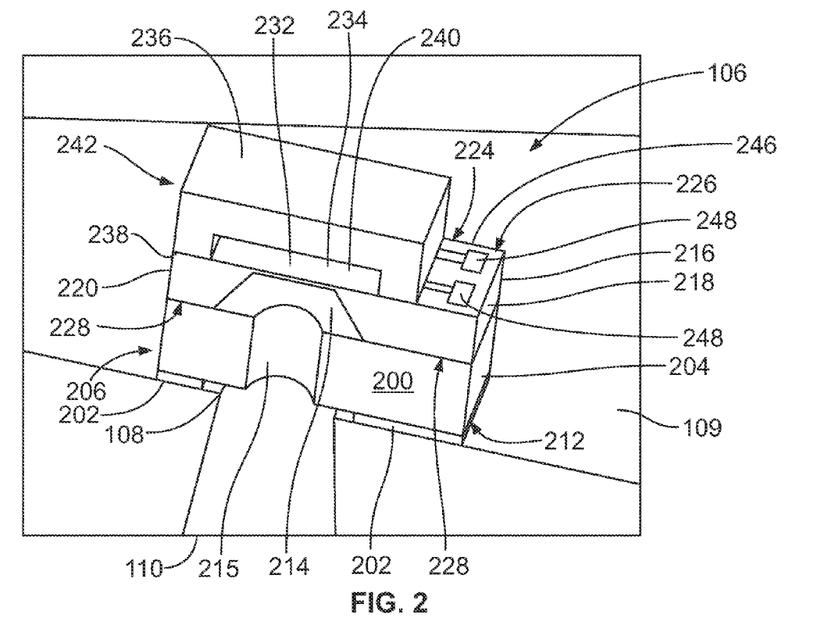
FIG. 2 is an isolated sectional view of a pressure sensor depicting a cross-sectional view of a pressure transducer.
Figure 3:
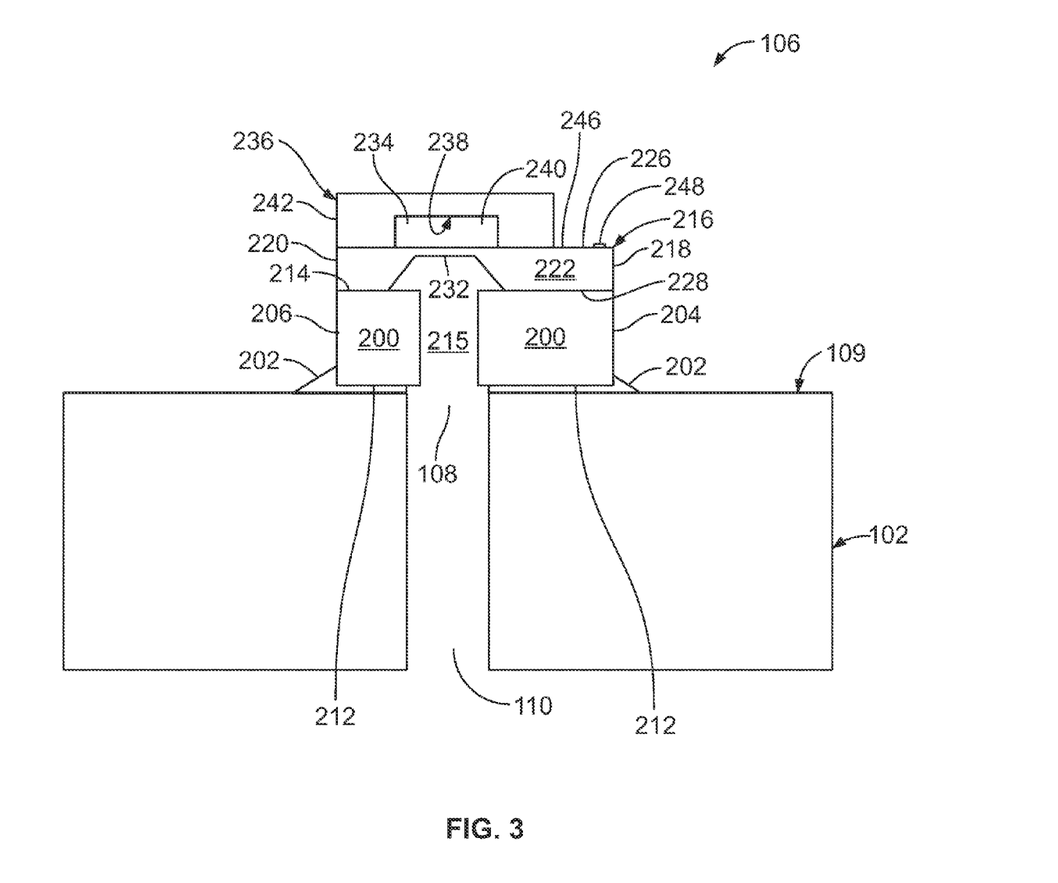
FIG. 3 is a sectional view of a pressure transducer.

FIG. 2 is an isolated, sectional view of the MEMS PRT 106, showing the structure of the MEMS PRT 106 in greater detail. FIG. 3 is a cross section of the pressure transducer 106.

For purposes of clarity, a polyhedron is considered herein to be a solid formed by plane faces. A parallelepiped is considered herein to be a 6-faced polyhedron, the faces of which are parallelograms that lie in pairs of opposing parallel planes. A rectangular parallelepiped is a parallelepiped, all faces of which are rectangles. A square is a rectangle, the four sides of which are equal. A cube is thus a parallelepiped as is a right rectangular parallelepiped.

The MEMS PRT 106 comprises a thin, glass pedestal 200 having a shape reminiscent of, or essentially the same as, a rectangular parallelepiped. The pedestal 200 is attached to the bottom 109 of the pocket 104 by a thin layer of adhesive 202.

Since the glass pedestal is shaped like a parallelepiped, the glass pedestal 200 of course comprises four sides, 204, 206, 208 (not visible) and 210 (not visible) and a bottom surface 212. The sides are substantially orthogonal to the bottom surface 212 of the pedestal 200. The bottom surface 212 of the pedestal 200 faces, and is attached to, the bottom 109 of the pocket 104. The sides 204, 206, 208, and 210 are also orthogonal to a top surface 214 of the pedestal 200, which faces upward.

Two of the sides 204, 206 of the pedestal 200 are short sides. The other two sides 208, 210 are long sides. For convenience, clarity, as well as claim construction purposes, the first short side 204 is denominated herein as the south side 204 of the pedestal 200. The second short side 206 is denominated as the north side 206 of the pedestal. The first long side 208, which is not visible in FIG. 2, is denominated as the west side, which is out of the drawing plane of FIG. 2 because FIG. 2 is a cross-sectional view of the pressure transducer 106. The second long side 210, which is opposite from the west side 208, not visible in FIG. 2, is denominated as the east side.

A pressurized-fluid-conducting hole 215 is formed through the pedestal 200. The pedestal 200 is positioned on the bottom 109 of the pocket 104 so that the hole 215 in the pedestal 200 is located directly above the opening 108 in the top surface 109 of the housing. The hole 215 in the pedestal 200 extends between the bottom surface 212 of the pedestal 200 and the top surface 214 of the pedestal 200. The hole 215 is formed in the pedestal 200 such that the location of the hole 215 is offset between the north and south sides, which means that the hole 215 is closer to the north side 206 than to the south side 204. Locating the hole 215 closer to the north side 206 means that the surface area of the bottom 212 of the pedestal 200 that is between the hole 215 and south side 204, is greater than the surface area of the bottom 212 of the pedestal 200 that is between the hole 215 and the north side 206.

A MEMS PRT die 216, also having a shape reminiscent of a rectangular parallelepiped, is attached to the top 214 surface of the glass pedestal 200 by an anodic bond, not visible in the figures but well known to those of ordinary skill in the art. As with the pedestal 200, the MEMS PRT die 216 has two short sides 218, 220 and two long sides 222 (not visible) and 224. For clarity as well as claim construction purposes, the first short side 218 of the die 216 is denominated as the south side 218 of the die 216. The second, opposite short side 220 is denominated as the north side 220 of the die 216. The first and second long sides 222, 224 are denominated as west and east sides, respectively. As with the sides of the pedestal 200, the sides 218, 220, 222, and 224 of the die 216 are orthogonal to a top surface 226 of the die 216 and orthogonal to a bottom surface 228 of the die 216.

Still referring to FIG. 2, a portion of the bottom surface 228 of the MEMS PRT die 216 is etched to form a very thin diaphragm 232. The diaphragm 232 is formed into the die 216 so that when the die 216 is attached to the pedestal 200, the center of the diaphragm is preferably located above the center of the hole 215 in the pedestal 200. As with the offset hole 215 in the pedestal 200, however, the location of the diaphragm 232 in the die 216 is also offset relative to the north side 220 and south side 218 of the MEMS PRT die 216 such that the diaphragm 232 is closer to the north side 220 of the die 216 than it is to the south side 218 of the die 216. The area of the bottom 228 of the die 216 that is "south" of the diaphragm 232 and attached to the top surface 214 of the pedestal 200 is thus greater than the area of the bottom 228 of the die 216 that is attached to the top surface 214 of the pedestal 200 that is "north" of the diaphragm 232.

Pressurized fluid, not shown, flows through the port 110 in the housing and through the hole 215 in the pedestal 200 and against the diaphragm 232. The pressurized fluid thus applies a distributed force against the diaphragm 232, which will cause the diaphragm to deflect upwardly or downwardly. The diaphragm 232 will thus deflect responsive to changes in the pressure of fluid in the port 100. When the diaphragm 232 deflects, it changes the physical dimensions of piezoresistors formed into the top surface of the diaphragm 232, which changes their electrical resistances.

The piezoresistors are formed into the top surface of the diaphragm 232 using conventional semiconductor fabrication processes. The piezoresistors so formed are connected together to form a Wheatstone bridge, which is a circuit topology well known to those of ordinary skill in the art. When a voltage is applied to the two input nodes of the Wheatstone bridge, an output voltage from the circuit's output nodes will change responsive to pressure changes. The diaphragm 232 and its included piezoresistors thus transduce a pressure change into a measurable electrical voltage.

The deflection of the diaphragm 232 is enhanced by an evacuated space 234 above the diaphragm 232. An evacuated space is defined by an open volume or cavity 240 formed inside a glass cap 236. The cavity 240, which is typically formed by etching, is considered to have a bottom surface which is identified by reference numeral 238.

The cap 236 is attached to the top surface 226 of the MEMS PRT die 216 by an anodic bond, not shown in the figures but well known to those of ordinary skill in the art. The cap 236 is located on the top surface 232 of the die 216 such that the north side 242 of the cap 236 aligns with the north side 220 of the die 216.

The width of the cap 236 is substantially the same as the width of the die 216. The length of the cap 236, however, is less than the length of the die 216. When the cap 236 is attached to the top surface 226 of the die 216 such that the north side 242 of the cap 236 is aligned with the north side 220 of the die 216, the cap 236 leaves an extended portion 246 of the die 216 exposed. The extended portion 246 is adjacent to the south side 218 of the die 216. Electrically conductive bond pads 248 are located in the exposed extended portion 246 of the top surface 226 of the die 216. The bond pads 248 are electrical contacts for the piezoresistive Wheatstone bridge formed in the top surface 226 of the MEMS PRT die 216 by the four piezoresistors formed into the top surface of the diaphragm 232.

Figure 4:
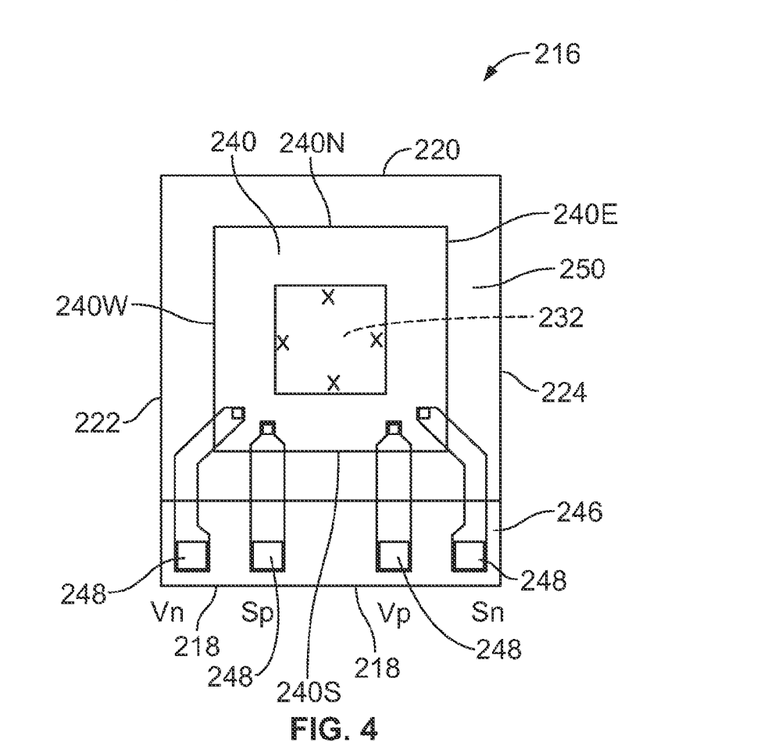
FIG. 4 is a top view of a MEMS PRT die.

FIG. 4 is a top view of the MEMS PRT die 216. Keeping in mind that physical deformation of the piezoresistors changes their electrical resistance, pressure-sensing piezoresistors are preferably located close to the edge of the diaphragm 232 for higher pressure sensitivity. FIG. 4 thus shows four possible, near-the-edge-of-the-diaphragm locations for a Wheatstone bridge circuit indicated by the letter X. The reference numeral 250 shows an anodic bond width between the MEMS PRT die 216 and the glass cap 236. The four inner edges of the cap cavity 240 are denoted as 240S, 240E, 240N, and 240W, respectively.

Computer models of the pressure transducer 106 show that locating the Wheatstone bridge toward the north side 220 of the die 216 will reduce the generation of thermally-generated electrical noise output from the Wheatstone bridge below what would be generated by locating the Wheatstone bridge near the south side of the die 216. Locating the Wheatstone bridge along either the west side 222 or the east side 224 will also reduce thermally-generated electrical noise below what would be generated along the south side.

Figure 5:
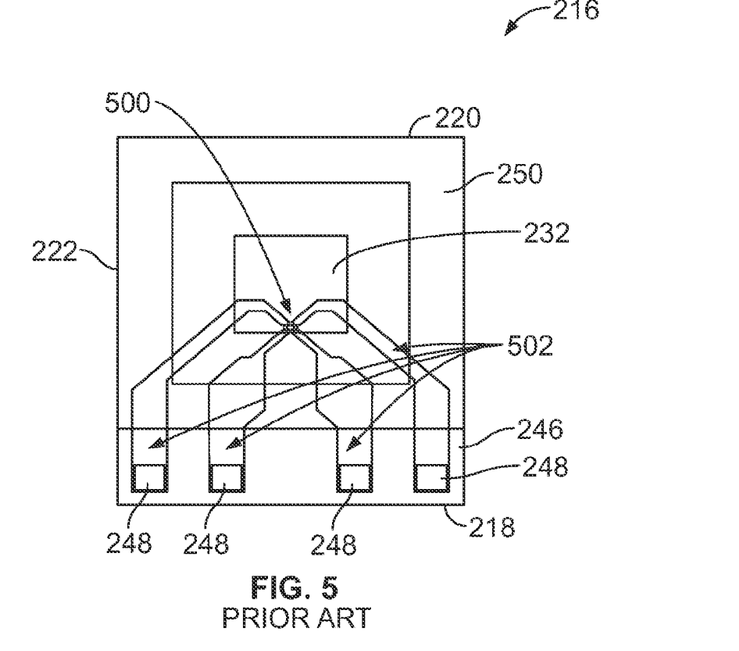
FIG. 5 is a top view of a prior art MEMS PRT die.

FIG. 5 is a top view of a prior art MEMS PRT die showing the location of the Wheatstone bridge circuit 500 on the top surface of the diaphragm 232. The bond pads 248 are connected to the resistors of the Wheatstone bridge circuit by conductive traces 502 that are formed into the top surface 226 of the MEMS PRT die 216.

Those of ordinary skill in the MEMS PRT art know that glass, silicon, plastic and adhesive have different coefficients of thermal expansion. Those differences invariably create thermally-induced stress in a MEMS PRT die. Computer models of prior art, rectangular-shaped MEMS PRTs show that an unfortunate consequence of locating the diaphragm of a MEMS PRT die away from the middle of the die, i.e., offset toward one side of the die, is that the thermally-induced stresses are unequal on opposite sides of the diaphragm.

As can be seen in FIGS. 1-3, the area of the bottom surface 212 of the pedestal 200 that is between the hole 215 and the south side 204 of the pedestal is greater than the area between the hole 215 and the north side 206 of the pedestal. When the temperature of the plastic housing, adhesive, and glass fluctuates, the thermally-induced stresses on the portion of the pedestal 200 between the hole 215 and south side 204 will be greater than the thermally-induced stress on the portion of the pedestal 200 between the hole 215 and the north side 206.

FIGS. 1-3 also show that the area of the bottom surface 228 of the die 216 that is between the diaphragm 232 and the south side 218 of the die 216 is greater than the area of the bottom surface 228 of the die 216 between the diaphragm 232 and the north side 220 of the die 216. The size and strength of the anodic bonds in those two areas are different. When the temperature of the glass pedestal and die fluctuates, thermally-induced stress on the portion of the die between the diaphragm 232 and south side 218 will be greater than the thermally-induced stress on the portion of the die located between the diaphragm 232 and the north side 220.

Since it is preferable to locate the piezoresistors of the Wheatstone bridge circuit where they will experience the least amount of thermally-induced stress, it is preferable to locate the piezoresistors away from the bond pads, which in the figures, is along the north side of the transducer 106. Stated another way, when a pressure-responsive diaphragm is not located at or near the center of a rectangular or substantially rectangular die having two short sides and two long sides, the piezoresistors should be located in the diaphragm away from the larger area of the bottom of the die and pedestal. Computer models show that significantly improved piezoresistive pressure sensing can be accomplished by locating the Wheatstone bridge circuit as far away from the bond pads as possible.

Figure 6:
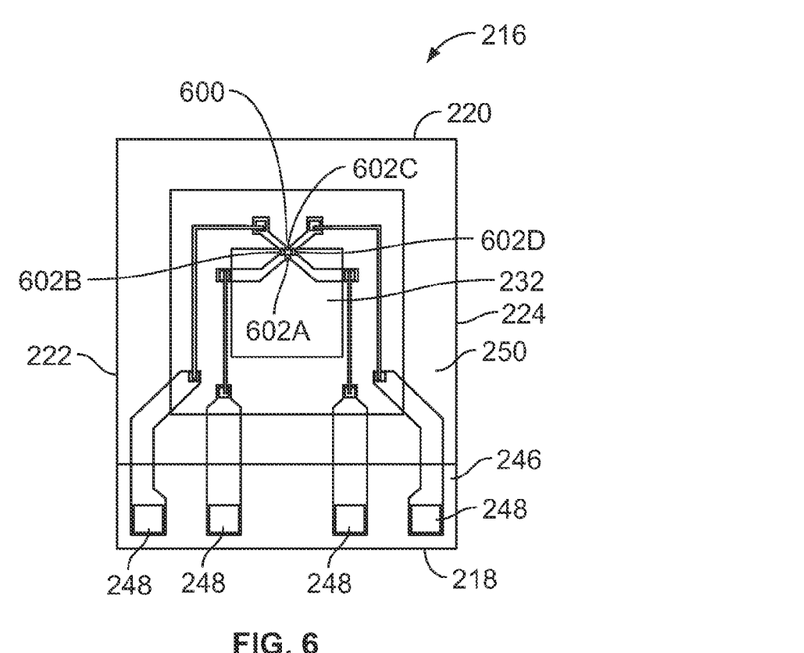
FIG. 6 is a top view of a MEMS PRT die showing a location of a Wheatstone bridge circuit in accordance with embodiments of the invention.

FIG. 6 is a top view of an embodiment of a substantially rectangular MEMS PRT die 216. The die 216 can be seen to have two short sides 218, 220 and two long sides 222, 224. Four bond pads 248 are formed into the top surface 226 of the die 216 and adjacent to a first one of the short sides 218. The diaphragm 232 as shown in FIG. 6, is formed into the opposite bottom surface of the die, which is responsive to pressure applied to the diaphragm through the pressure port depicted in FIGS. 1 and 2. A substantially-rectangular extended portion 246 where bond pads 248 are located is directly above the aforementioned large area of the bottom surface of the die 216 anodically bonded to the top surface of the glass pedestal 200, below which is the large area of the bottom surface of the pedestal 200 that is attached to a corresponding area of the plastic housing by adhesive 202.

A Wheatstone bridge circuit 600, well known to those of ordinary skill in the art, comprises four piezoresistors 602A-602D formed into the top surface 226 and located as close as possible to the second short side or north side 220. Locating the Wheatstone bridge circuit 600 away from the bond pads 248 and away from the large area that is anodically bonded to the pedestal reduces the stress applied to the piezoresistors by thermal expansion coefficient differences between the pedestal, the adhesive that attaches the die to the pedestal, and the die itself.

Figure 7:
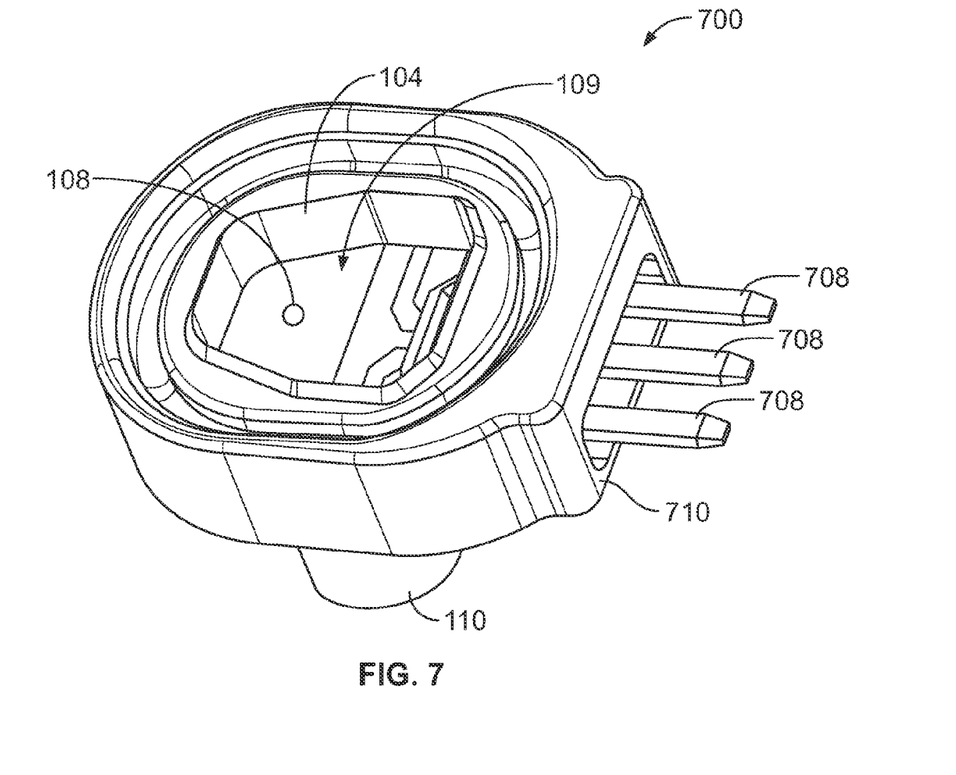
FIG. 7 is a perspective view of a pressure sensor housing with lead frames.
Figure 8:
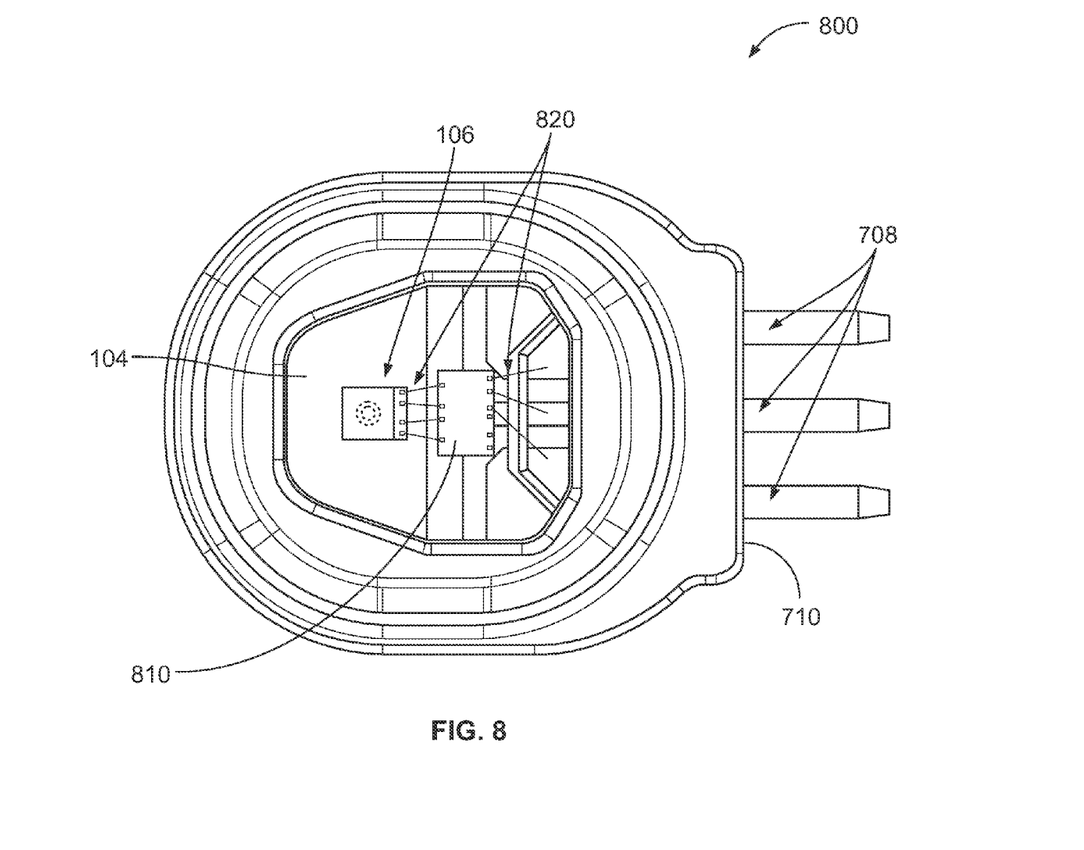
FIG. 8 is an isolated top view of a pressure sensor.

FIG. 7 is a perspective view of a pressure sensor housing 700 with the PRT 106 removed to show the location of the hole 108 in the bottom 109 of the pocket 104. FIG. 8 is a top view of a pressure sensor 800 looking into the aforementioned pocket 104 formed into the housing 700. The pressure sensor 800 can be seen to include the aforementioned pressure transducer 106. An application specific integrated circuit (ASIC) 810 is connected to the bond pads 248 on the MEMS PRT 106 by short, small diameter wires 820. Lead frames 708 extend through the housing 700 to an exterior surface 710 of the housing 700. The ends of the lead frames 708 inside the pocket 104 are connected to the ASIC 810 by small wires 820 as shown in FIG. 8.

Those of ordinary skill in the art will recognize that the pedestal 200 and die 216 shown in the figures are both substantially rectangular. In another embodiment, a pedestal and die are substantially square with the diaphragm formed in the die being located away from the center and offset to one side of the die and pedestal.

While the embodiment of the transducer and sensor described above uses a glass pedestal, an alternate embodiment of the transducer and sensor use a pedestal made of single crystal silicon. In such an embodiment, the silicon pedestal is attached to the housing with adhesive and fusion bonded to the silicon MEMS PRT.

Those of ordinary skill in the art will recognize that the coefficient of thermal expansion of the pedestal should be as close as possible to the coefficient of thermal expansion of the die. Moreover, the adhesive or method of attaching the die to the pedestal should also reduce differences in the coefficient of thermal expansion between the die and the adhesive. In an embodiment, the glass pedestal has a coefficient of thermal expansion between about two and four per million per degree centigrade. A preferred coefficient of thermal expansion of the glass pedestal is about 3e-6/° C.

The cap is preferably square and encloses an evacuated volume above the diaphragm. The cap may also be rectangular so long as bond pads on the top surface of the MEMS PRT die are exposed. While an embodiment of the transducer and sensor described above uses a glass cap, another embodiment of the transducer and sensor use a cap made of single crystal silicon, which is fusion-bonded to the silicon MEMS PRT.

In yet another embodiment, the cap can be omitted to form either a top-side absolute pressure transducer or a differential pressure sensor.

The foregoing description is for purposes of illustration only. The true scope of the invention is set forth in the following claims.

The invention claimed is:

1. A pressure transducer, comprising:
    a substantially parallelepiped-shaped die having top and bottom surfaces and having south, north, west, and east sides, the north and south sides opposing each other, and the east and west sides opposing each other;
    a plurality of in-line bond pads formed into the top surface along the south side;
    a diaphragm formed into the bottom surface and responsive to pressure of a fluid;
    a Wheatstone bridge comprising four piezoresistors formed into the top surface, the four piezoresistors being clustered and located adjacent to a diaphragm edge near the north side, and the four piezoresistors being electrically coupled to the in-line bond pads, whereby all four of the piezoresistors being clustered and located adjacent to a single side of the diaphragm opposite from where the bond pads are located, as opposed to closer to where the bond pads are located, reduces thermally-induced noise that is output by the Wheatstone bridge and that is induced by thermal mismatch caused by bonding a plurality of different types of material together.

2. The pressure transducer of claim 1, wherein the parallelepiped-shaped the is substantially rectangular.

3. The pressure transducer of claim 1 further comprising a pedestal attached to the bottom surface of the die.

4. The pressure transducer of claim 3, wherein the pedestal is glass.

5. The pressure transducer of claim 3, wherein the pedestal is silicon.

6. The pressure transducer of claim 3, wherein the pedestal is formed to have a pressure port aligned with the diaphragm.

7. The pressure transducer of claim 1, further comprising a cap configured to cover the diaphragm and defining an enclosed evacuated volume above the diaphragm.

8. The pressure transducer of claim 7, wherein the cap is rectangular.

9. The pressure transducer of claim 7, wherein the cap is square.

10. A pressure transducer, comprising;
    a die having top and bottom surfaces and having four sides including south, north, west, and east sides;
    a plurality of in-line bond pads formed into the top surface along the south side;
    a diaphragm formed into the bottom surface and responsive to pressure of a fluid;
    a Wheatstone bridge comprising four piezoresistors formed into the top surface, the four piezoresistors being clustered and located adjacent to a diaphragm edge near one of the west and east sides, and the four piezoresistors being electrically coupled to the in-line bond pads, whereby all four of the piezoresistors being clustered and located adjacent to a single side of the diaphragm farther from where the bond pads are located, as opposed to closer to where the bond pads are located, reduces thermally-induced noise that is output by the Wheatstone bridge and that is induced by thermal mismatch caused by bonding a plurality of different types of material together.

11. The pressure transducer of claim 10 further comprising a pedestal attached to the bottom surface of the die.

12. The pressure transducer of claim 11, wherein the pedestal is glass.

13. The pressure transducer of claim 11, wherein the pedestal is silicon.

14. The pressure transducer of claim 11, wherein the pedestal is formed to have a pressure port aligned with the diaphragm.

15. The pressure transducer of claim 10, further comprising a cap configured to cover the diaphragm and defining an enclosed evacuated volume above the diaphragm.

16. The pressure transducer of claim 15, wherein the cap is rectangular.

17. The pressure transducer of claim 15, wherein the cap is square.

18. A pressure sensor comprising;
a housing having a pocket;
a pressure transducer inside the pocket, the pressure transducer comprising:
  i) a die having top and bottom surfaces and having four sides including south, north, west, and east sides;
  ii) a plurality of in-line bond pads formed into the top surface along the south side;
  iii) a diaphragm formed into the bottom surface and responsive to pressure of a fluid;
  iv) a Wheatstone bridge comprised of four piezoresistors formed into the top surface, the four piezoresistors being clustered and located adjacent to a diaphragm edge near the north side and being electrically coupled to the in-line bond pads, whereby all four of the piezoresistors being clustered and located adjacent to a single side of the diaphragm opposite from where the bond pads are located, as opposed to closer to where the bond pads are located, reduces thermally-induced noise that is output by the Wheatstone bridge and that is induced by thermal mismatch caused by bonding a plurality of different types of material together; and
a pressure port extending through the housing to the diaphragm.

19. The pressure sensor of claim 18, further comprising:
an application specific integrated circuit located within the pocket;
a plurality of wires coupling the application specification integrated circuit to corresponding bond pads; and
a plurality of lead frames extending from the application specific integrated circuit to an exterior surface of the housing.

20. A pressure sensor comprising;
a housing having a pocket;
a pressure transducer inside the pocket, the pressure transducer comprising:
  i) a die having top and bottom surfaces and having four sides including south, north, west, and east sides;
  ii) a plurality of in-line bond pads formed into the top surface along the south side;
  iii) a diaphragm formed into the bottom surface and responsive to pressure of a fluid;
  iv) a Wheatstone bridge comprised of four piezoresistors formed into the top surface, the four piezoresistors being clustered and located adjacent to a diaphragm edge near one of the west and east sides, and the four piezoresistors being electrically coupled to the in-line bond pads, whereby all four of the piezoresistors being clustered and located adjacent to a single side of the diaphragm farther from where the bond pads are located, as opposed to closer to where the bond pads are located, reduces thermally-induced noise that is output by the Wheatstone bridge and that is induced by thermal mismatch caused by bonding a plurality of different types of material together; and
a pressure port extending through the housing to the diaphragm.

21. The pressure sensor of claim 20, further comprising:
an application specific integrated circuit located within the pocket;
a plurality of wires coupling the application specification integrated circuit to corresponding bond pads; and
a plurality of lead frames extending from the application specific integrated circuit to an exterior surface of the housing.

* * * * *